United States Patent
Alpert et al.

(10) Patent No.: US 8,793,636 B2
(45) Date of Patent: Jul. 29, 2014

(54) PLACEMENT OF STRUCTURED NETS

(75) Inventors: Charles J. Alpert, Austin, TX (US); Myung-Chul Kim, Austin, TX (US); Zhuo Li, Cedar Park, TX (US); Natarajan Viswanathan, Austin, TX (US); Samuel I. Ward, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 174 days.

(21) Appl. No.: 13/086,428

(22) Filed: Apr. 14, 2011

(65) Prior Publication Data

US 2012/0266124 A1    Oct. 18, 2012

(51) Int. Cl.
    *G06F 17/50* (2006.01)
(52) U.S. Cl.
    USPC ........... 716/119; 716/110; 716/118; 716/123; 716/132
(58) Field of Classification Search
    USPC .......................................................... 716/119
    See application file for complete search history.

(56) References Cited

U.S. PATENT DOCUMENTS

| | | | |
|---|---|---|---|
| 5,513,124 A * | 4/1996 | Trimberger et al. | 716/116 |
| 6,266,802 B1 | 7/2001 | Malm et al. | |
| 6,792,585 B1 * | 9/2004 | Ku et al. | 716/122 |
| 7,076,755 B2 | 7/2006 | Ren et al. | |
| 7,467,369 B2 | 12/2008 | Alpert et al. | |
| 7,653,884 B2 | 1/2010 | Furnish et al. | |
| 7,831,947 B2 * | 11/2010 | Wang et al. | 716/122 |
| 7,840,928 B1 | 11/2010 | Datta et al. | |
| 2007/0245281 A1 | 10/2007 | Riepe et al. | |
| 2009/0254874 A1 | 10/2009 | Bose | |
| 2011/0023000 A1 | 1/2011 | Dirks et al. | |

* cited by examiner

*Primary Examiner* — Vuthe Siek
*Assistant Examiner* — Eric Lee
(74) *Attorney, Agent, or Firm* — Stephen J. Walder, Jr.; Parashos T. Kalaitzis

(57) ABSTRACT

Mechanisms are provided for performing placement of cells in a design of a semiconductor device. An initial design of the semiconductor device is generated, the initial design comprising a first placement of cells. A preferred direction of placement associated with the cells is determined. The preferred direction is a direction along which spreading of the cells is preferred. A second design of the semiconductor device is generated by modifying the first placement of the cells to generate a second placement of cells, different from the first placement cells, based on the preferred direction of placement associated with the cells.

23 Claims, 6 Drawing Sheets

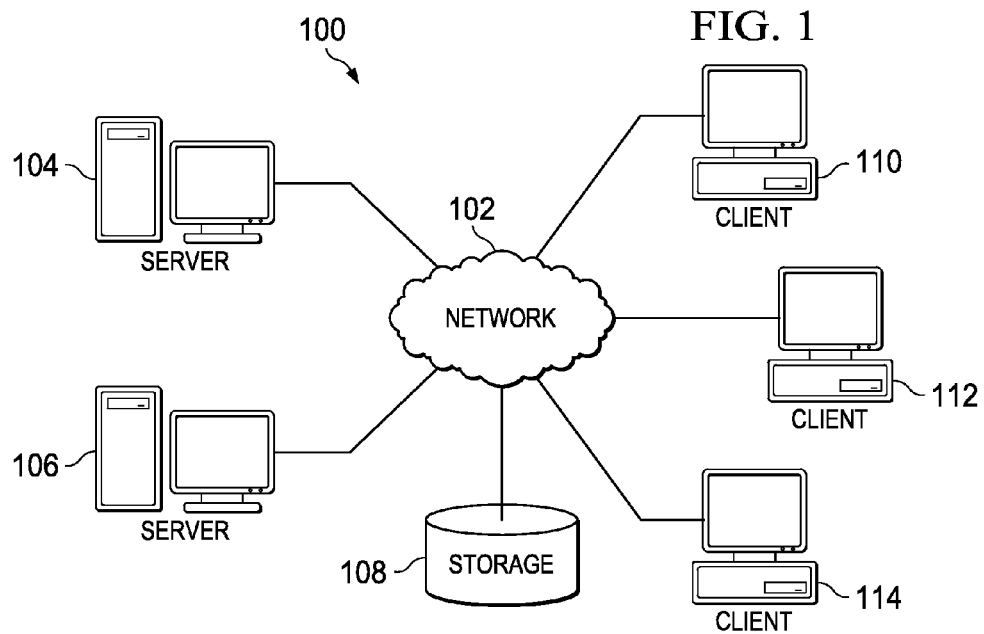
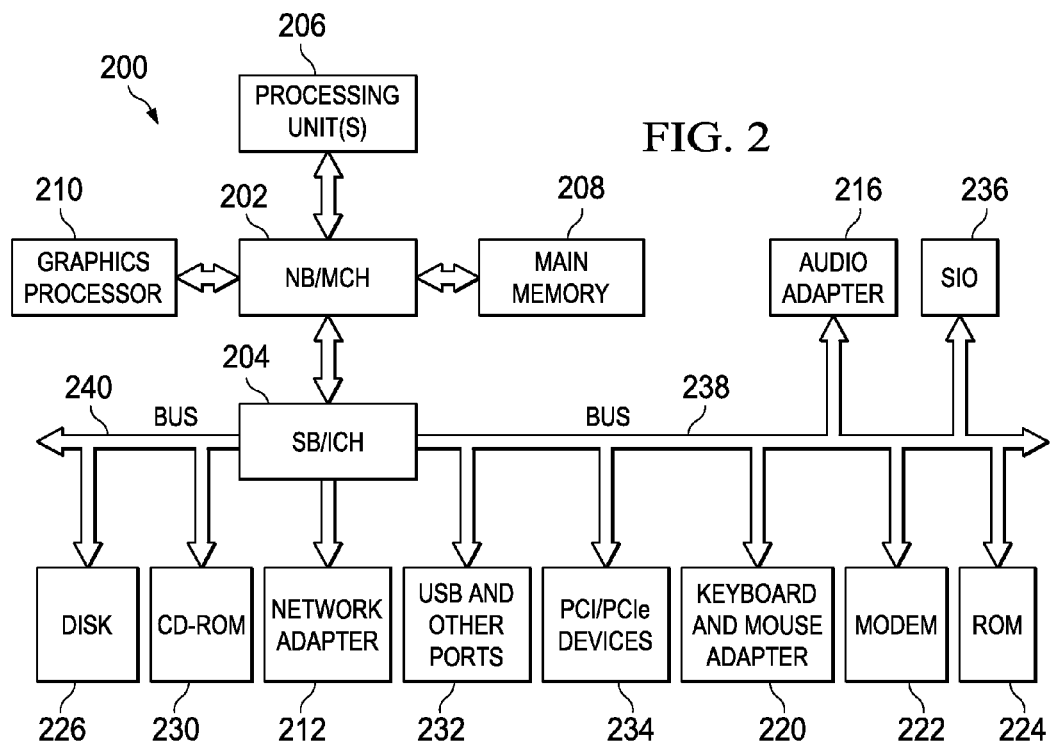

PLACEMENT OF STRUCTURED NETS

BACKGROUND

The present application relates generally to an improved data processing apparatus and method and more specifically to mechanisms for providing improved placement of structured nets, e.g., high fanout nets and high fanout paths, in integrated circuit design, synthesis, verification, and fabrication.

Physical synthesis is the process in which a semiconductor device is taken from the list of components and connections, referred to as a netlist, to a geometrical layout of the device. Placement processes are critical processes in physical synthesis. The task of placement processes is to determine the overall locations of standard cells or modules in a semiconductor device design. Each cell/module is a set of electrical components with input and output pins interconnected by a set of nets. After the placement process is completed, the resulting semiconductor device design is typically optimized with respect to device timing.

Transformations may be performed during the placement process to reduce the weighted total wire length (WTWL) of the device. During each transformation, the cells/modules of the design may be recursively moved according to transform guidelines. The placement of the cells after these moves may or may not be legal according to a set of design rules and thus, the transformation may also need to legalize the placement by moving cells/modules to ensure that the transformed placement meets the requirements, or does not result in a violation of, the design placement rules. After legalization, the transformation has produced a new legal placement of the cells/modules.

The placement operation is broken down into three steps: (a) global placement, (b) legalization, and (c) detailed placement. With global placement, an intial placement solution is generated for in the manner summarized above using transformations. Global placement ignores the non-overlapping constraint among the cells/modules. In this stage, the placement process has a global view of the entire netlist and optimizes the design objective(s) to obtain approximate locations for the cells/modules.

Once the initial placement solution is obtained through global placement operations, legalization ensures that the initial placement solution does not violate established placement rules and if the initial placement solution does violate any of these placement rules, the placement solution is adjusted to ensure legal placement of the cells/modules. With legalization, the overlap among the modules are resolved to obtain a "legal" overlap-free placement, for example.

Finally, detailed placement is performed to further optimize the design objective in a local region. For example, detailed placement may perform transformations of the placement solution of the semiconductor device design to convert cell/module placement from one location to another location within the device. These transformations may not only modify the placement of cells/modules but may also insert new cells/modules or change the size of existing cells/modules. The transformations are generally an iterative process performing a series of incremental move steps. Placement changes during detailed placement may again result in overlaps between cells/modules. Thus, legalization operations may further be performed during detailed placement so as to remove the cell/module overlaps. Legalization operations for detailed placement are designed to minimize the disturbance to the original placement by taking a legally placed netlist and changing locations of cells/modules while still maintaining legality.

Current microprocessor trends integrate custom designs with random logic macros (RLMs) to generate very large integrated circuit designs. In some cases, entire microprocessor units are designed using an automated synthesis flow that integrates these traditional custom designs and RLMs. This type of merged synthesis is often referred to as Large Block Synthesis (LBS). The LBS blocks, i.e. sets of cells/modules, require handling dataflow designs differently than traditional RLMs because RLM logic placement optimizes the locations of cells/modules for low fanout nets, e.g., 1 to 4 pin connectors. RLM logic placement optimizes for low fanout nets because RLMs typically have very few, if any, high fanout nets (HFNs), e.g., one or more hundreds of pin connectors. In dataflow design, however, HFN placement significantly impacts overall timing closure. Thus, RLM placement, which has been traditionally used for LBS, does not provide an optimum placement of logic blocks having high fanout nets.

SUMMARY

In one illustrative embodiment, a method, in a data processing system, is provided for performing placement of cells in a design of a semiconductor device. The method comprises generating an initial design of the semiconductor device, the initial design comprising a first placement of cells. The method further comprises determining a preferred direction of placement associated with the cells. The preferred direction is a direction along which spreading of the cells is preferred. Moreover, the method comprises generating a second design of the semiconductor device by modifying the first placement of the cells to generate a second placement of cells, different from the first placement cells, based on the preferred direction of placement associated with the cells.

In other illustrative embodiments, a computer program product comprising a computer useable or readable medium having a computer readable program is provided. The computer readable program, when executed on a computing device, causes the computing device to perform various ones of, and combinations of, the operations outlined above with regard to the method illustrative embodiment.

In yet another illustrative embodiment, a system/apparatus is provided. The system/apparatus may comprise one or more processors and a memory coupled to the one or more processors. The memory may comprise instructions which, when executed by the one or more processors, cause the one or more processors to perform various ones of, and combinations of, the operations outlined above with regard to the method illustrative embodiment.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein:

FIG. 1 is an example diagram of a distributed data processing system in which aspects of the illustrative embodiments may be implemented;

FIG. 2 is an example block diagram of a data processing system in which aspects of the illustrative embodiments may be implemented;

DETAILED DESCRIPTION

Figure 3:
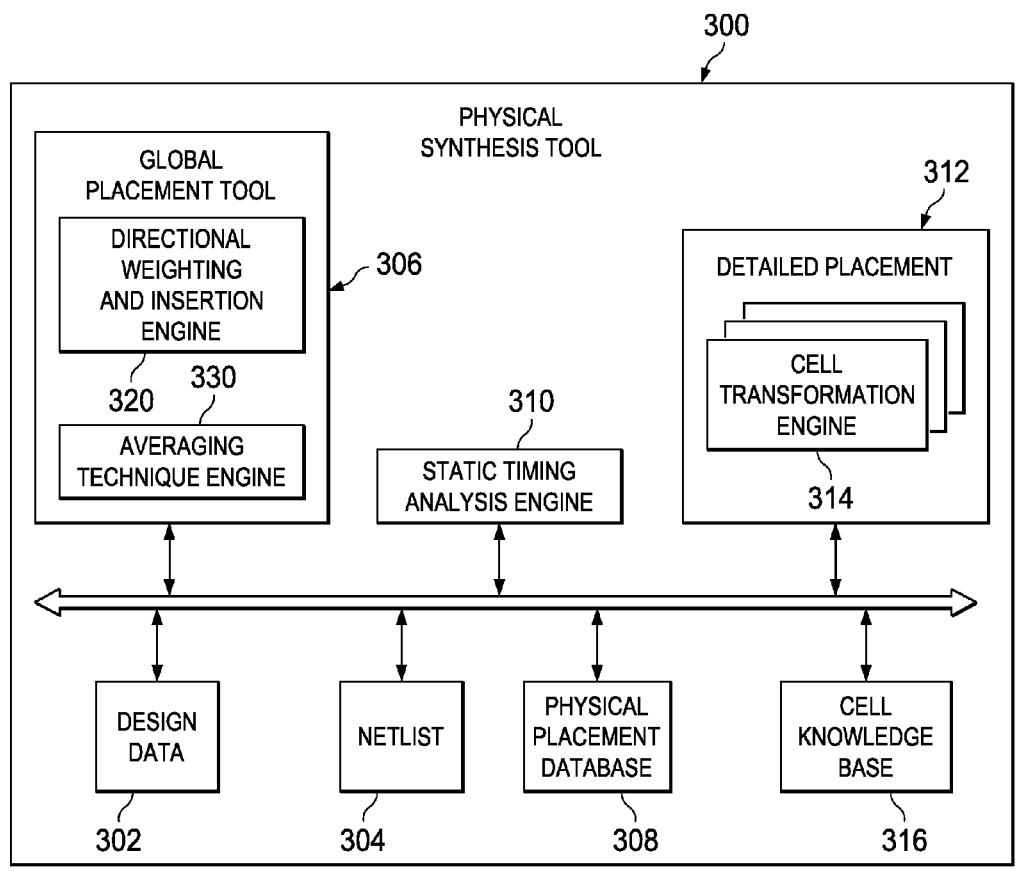
FIG. 3 is an example block diagram of the components of a physical synthesis tool in which the improved placement mechanisms of the illustrative embodiments may be implemented.

The illustrative embodiments provide mechanisms for improved placement of structured nets, e.g., high fanout nets or high fanout paths, which may include buffered or cloned nets, in integrated circuit design physical synthesis. While the illustrative embodiments may be implemented with regard to any type of structured net, for purposes of the description of the illustrative embodiments, the following description will focus on high fanout nets and high fanout paths. However, it should be appreciated that this is not intended to be a limitation on the application of the mechanisms of the illustrative embodiments and that the illustrative embodiments may operate on any type of structured net without departing from the spirit and scope of the present invention.

The illustrative embodiments operate based upon the realization that circuits for datapaths often have regular structures, also referred to as "cells," i.e. sets of electrical components, such as logic gates, logic functions, or the like, with input and output pins interconnected by a set of nets, that together define the datapaths. Such cells may be "standardized" cells meaning that they have a standard size for implementing some logic function. High fanout nets, i.e. interconnections of circuit logic elements or modules within an integrated circuit, utilize these standard cells, i.e. standard combinations of one or more circuit elements that together define a reoccurring structure, which often have ideal or preferred alignment directions/orientations, i.e. alignment directions/orientations along with spreading of the cells is preferred or ideal. These cells may be any placeable object in a VLSI design environment (dcaps/spare cells, logic gates, etc.).

The ideal or preferred alignment direction, or orientation, of these standard cells is dependent upon the particular combination of cells. For example, a row of latches in a matrix of cells may have an ideal alignment direction, or orientation, that is horizontal (or along an x-axis direction) in the integrated circuit design. A column of latches in a matrix of cells may have an ideal alignment direction/orientation that is vertical (or along a y-axis direction) in the integrated circuit design. As a further example, nets that are folded together may comprise two rows of cells that both have an ideal orientation that is horizontal. Other ideal directions/orientations for cells may not be strictly along Cartesian axises without departing from the spirit and scope of the illustrative embodiments. For example, for some configurations of integrated circuits, a net comprising a plurality of cells may have an ideal or preferred direction/orientation that is diagonal to Cartesian axises. Moreover, the integrated circuit design may be three-dimensional in nature and the ideal or preferred direction/orientation may be defined in terms of three-dimensions. Furthermore, the ideal direction/orientation may actual comprise multiple ideal directions/orientations, such as in the case of an "L" shape, box shape, or the like.

Current automatic placement mechanisms in current integrated circuit synthesis mechanisms for the design and manufacture of integrated circuits cannot find an optimal alignment for such datapath cells because they do not take into consideration these ideal or preferred directions/orientations of the datapath cells. Current automatic placement mechanisms are not designed to optimize high fanout nets or high fanout paths that have ideal alignment directions or orientations but instead are designed to perform placement of cells using assumptions that do not provide accurate wirelength approximations for high fanout nets. That is, placement operations often seek to optimize wirelength and use various approximations for determining wirelength. For example, current automatic placement mechanisms use either half-perimeter wirelength (HPWL) or Steiner tree wirelength approximations as the driving factor in determining placement of the datapath cells. For a particular net in the design or integrated circuit, the HPWL is half the length of the perimeter of the smallest bounding box that can contain all the pins of this net. Steiner tree wirelength approximations use Steiner trees, comprising vertices and edges between vertices, where Steiner points may be inserted into the tree to achieve an optimum wirelength.

The HPWL approximation for wirelength is a good first order approximation of routed wirelength in most semiconductor device, e.g., integrated circuit, designs where the cells have low fanout nets. That is, in many designs the overall wirelength contribution due to low fanout nets having 1-4 pins is far larger than the contribution of high fanout nets and thus, the use of HPWL to perform wirelength approximation is sufficient. However, in designs where the wirelength contribution of high fanout nets is greater than usual, using only HPWL-driven optimization for performing placement can be misleading and result in sub-optimal placement of cells.

The illustrative embodiments utilize prior knowledge of the ideal direction/orientation of high fanout nets as constraints for more intelligent automatic placement of cells during global and/or detailed placement processes. Moreover, the illustrative embodiments may use one or more of directional net weightings or averaging techniques to incorporate these direction/orientation constraints during placement processes. Using these mechanisms, the illustrative embodiments obtain a placement solution that reflects the designer's intent about aspect ratio of placement for a set of cells and achieves an improved wirelength approximation, e.g., improved Steiner tree wirelength approximation.

As will be appreciated by one skilled in the art, the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in any one or more computer readable medium(s) having computer usable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in a baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Computer code embodied on a computer readable medium may be transmitted using any appropriate medium, including but not limited to wireless, wireline, optical fiber cable, radio frequency (RF), etc., or any suitable combination thereof.

Computer program code for carrying out operations for aspects of the present invention may be written in any combination of one or more programming languages, including an object oriented programming language such as Java™, Smalltalk™, C++, or the like, and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to the illustrative embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions that implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Thus, the illustrative embodiments may be utilized in many different types of data processing environments including a distributed data processing environment, a single data processing device, or the like. In order to provide a context for the description of the specific elements and functionality of the illustrative embodiments, FIGS. 1 and 2 are provided hereafter as example environments in which aspects of the illustrative embodiments may be implemented. It should be appreciated that FIGS. 1-2 are only examples and are not intended to assert or imply any limitation with regard to the environments in which aspects or embodiments of the present invention may be implemented. Many modifications to the depicted environments may be made without departing from the spirit and scope of the present invention.

With reference now to the figures, FIG. 1 depicts a pictorial representation of an example distributed data processing system in which aspects of the illustrative embodiments may be implemented. Distributed data processing system 100 may include a network of computers in which aspects of the illustrative embodiments may be implemented. The distributed data processing system 100 contains at least one network 102, which is the medium used to provide communication links between various devices and computers connected together within distributed data processing system 100. The network 102 may include connections, such as wire, wireless communication links, or fiber optic cables.

In the depicted example, server 104 and server 106 are connected to network 102 along with storage unit 108. In addition, clients 110, 112, and 114 are also connected to network 102. These clients 110, 112, and 114 may be, for example, personal computers, network computers, or the like. In the depicted example, server 104 provides data, such as boot files, operating system images, and applications to the clients 110, 112, and 114. Clients 110, 112, and 114 are clients to server 104 in the depicted example. Distributed data processing system 100 may include additional servers, clients, and other devices not shown.

In the depicted example, distributed data processing system 100 is the Internet with network 102 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational and other computer systems that route data and messages. Of course, the distributed data processing system 100 may also be implemented to include a number of different types of networks, such as for example, an intranet, a local area network (LAN), a wide area network (WAN), or the like. As stated above, FIG. 1 is intended as an example, not as an architectural limitation for different embodiments of the present invention, and therefore, the particular elements shown in FIG. 1 should not be considered limiting with regard to the environments in which the illustrative embodiments of the present invention may be implemented.

With reference now to FIG. 2, a block diagram of an example data processing system is shown in which aspects of the illustrative embodiments may be implemented. Data processing system 200 is an example of a computer, such as client 110 in FIG. 1, in which computer usable code or instructions implementing the processes for illustrative embodiments of the present invention may be located.

In the depicted example, data processing system 200 employs a hub architecture including north bridge and memory controller hub (NB/MCH) 202 and south bridge and input/output (I/O) controller hub (SB/ICH) 204. Processing unit 206, main memory 208, and graphics processor 210 are connected to NB/MCH 202. Graphics processor 210 may be connected to NB/MCH 202 through an accelerated graphics port (AGP).

In the depicted example, local area network (LAN) adapter 212 connects to SB/ICH 204. Audio adapter 216, keyboard and mouse adapter 220, modem 222, read only memory (ROM) 224, hard disk drive (HDD) 226, CD-ROM drive 230, universal serial bus (USB) ports and other communication ports 232, and PCI/PCIe devices 234 connect to SB/ICH 204 through bus 238 and bus 240. PCI/PCIe devices may include, for example, Ethernet adapters, add-in cards, and PC cards for notebook computers. PCI uses a card bus controller, while PCIe does not. ROM 224 may be, for example, a flash basic input/output system (BIOS).

HDD 226 and CD-ROM drive 230 connect to SB/ICH 204 through bus 240. HDD 226 and CD-ROM drive 230 may use, for example, an integrated drive electronics (IDE) or serial advanced technology attachment (SATA) interface. Super I/O (SIO) device 236 may be connected to SB/ICH 204.

An operating system runs on processing unit 206. The operating system coordinates and provides control of various components within the data processing system 200 in FIG. 2. As a client, the operating system may be a commercially available operating system such as Microsoft Windows 7 (Microsoft and Windows are trademarks of Microsoft Corporation in the United States, other countries, or both). An object-oriented programming system, such as the Java programming system, may run in conjunction with the operating system and provides calls to the operating system from Java programs or applications executing on data processing system 200 (Java is a trademark of Oracle and/or its affiliates.).

As a server, data processing system 200 may be, for example, an IBM® eServer™ System p® computer system, running the Advanced Interactive Executive (AIX®) operating system or the LINUX operating system (IBM, eServer, System p, and AIX are trademarks of International Business Machines Corporation in the United States, other countries, or both, and LINUX is a registered trademark of Linus Torvalds in the United States, other countries, or both). Data processing system 200 may be a symmetric multiprocessor (SMP) system including a plurality of processors in processing unit 206. Alternatively, a single processor system may be employed.

Instructions for the operating system, the object-oriented programming system, and applications or programs are located on storage devices, such as HDD 226, and may be loaded into main memory 208 for execution by processing unit 206. The processes for illustrative embodiments of the present invention may be performed by processing unit 206 using computer usable program code, which may be located in a memory such as, for example, main memory 208, ROM 224, or in one or more peripheral devices 226 and 230, for example.

A bus system, such as bus 238 or bus 240 as shown in FIG. 2, may be comprised of one or more buses. Of course, the bus system may be implemented using any type of communication fabric or architecture that provides for a transfer of data between different components or devices attached to the fabric or architecture. A communication unit, such as modem 222 or network adapter 212 of FIG. 2, may include one or more devices used to transmit and receive data. A memory may be, for example, main memory 208, ROM 224, or a cache such as found in NB/MCH 202 in FIG. 2.

Those of ordinary skill in the art will appreciate that the hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. Also, the processes of the illustrative embodiments may be applied to a multiprocessor data processing system, other than the SMP system mentioned previously, without departing from the spirit and scope of the present invention.

Moreover, the data processing system 200 may take the form of any of a number of different data processing systems including client computing devices, server computing devices, a tablet computer, laptop computer, telephone or other communication device, a personal digital assistant (PDA), or the like. In some illustrative examples, data processing system 200 may be a portable computing device which is configured with flash memory to provide non-volatile memory for storing operating system files and/or user-generated data, for example. Essentially, data processing system 200 may be any known or later developed data processing system without architectural limitation.

The illustrative embodiments may be implemented on a stand alone data processing system, such as illustrated in FIG. 2, for example, or a distributed data processing system, such as illustrated in the example of FIG. 1, for example. In one illustrative embodiment, a user of a client computing device, such as client computing device 110, may interact with a server computing device, such as server 104, via the client computing device 110 and one or more applications, applets, or the like. For example, the server 104 may provide an integrated circuit device design environment via one or more applications executing on one or more processors. The user may interact with the server 104 via client software executing on the client computing device 110 to design, synthesize, and verify an integrated circuit design. The integrated circuit design may then be used for fabricating the integrated circuit device. The server 104 may make use of data stored in client 110, the server 104, a network attached storage system, such as storage unit 108, or the like. One or more of the server 104, client 110, or even storage system 108 may make use of a data processing system such as illustrated in FIG. 2.

In accordance with one illustrative embodiment, the integrated circuit device design environment of the server 104 employs placement modules that implement one or more of the improved placement processes of the illustrative embodiments as described hereafter. Alternatively, the mechanisms of the illustrative embodiments may be implemented in an integrated circuit device design environment provided on a stand alone data processing system, such as illustrated in FIG. 2, for example, or the like. It should be appreciated that while reference is made to FIGS. 1 and 2 as providing examples of data processing systems in which aspects of the illustrative embodiments may be implemented, these are only examples and many modifications to the configurations shown in FIGS. 1 and 2 may be made without departing from the spirit and scope of the illustrative embodiments.

The mechanisms of the illustrative embodiments provide improved cell placement mechanisms which may be implemented in hardware, software, or any combination of hardware and software. In one illustrative embodiment, the cell placement mechanisms of the illustrative embodiments are implemented as software instructions, stored in one or more storage devices, such as memories, hard disk drives, or the like, and executed on one or more processors of one or more data processing devices or systems.

The placement mechanisms of the illustrative embodiments perform placement transformations on defined netlist representations of an integrated circuit device to generate an initial placement solution for placement of one or more cells. A cell is comprised of electrical components with input and output pins interconnected by a set of nets. A net, as defined herein, is comprised of the input and output pins and the wires in between the pins. A netlist is a list of nets for the electrical components. Legality means the cells are within the design rule overlap constraints. Design rules are defined by the design engineer and are typically based on the technology of the integrated circuit or semiconductor device.

The placement mechanisms generate an initial placement solution based on a preferred direction or orientation of the cells, referred to herein as directional weighting and insertion. The initial placement solution is obtained by applying relatively higher net weights to perpendicular directions/orientations to those of the preferred direction or orientation, or nets that are not substantially along the preferred direction/orientation. In other implementations, higher net weights may be applied to nets of the preferred direction/orientation, or nets that are substantially along the preferred direction/orientation. In doing so, the placement mechanisms reduce the span or spreading of the nets in a non-preferred direction or orientation.

The placement mechanisms of the illustrative embodiments further provide mechanisms for performing an averaging technique based optimization for improving the placement of the one or more cells. The averaging technique essentially determines an average value of the cells with regard to a preferred direction or orientation and uses this average value as a basis for performing move operations for improving placement of the cells.

Moreover, the placement mechanisms of the illustrative embodiments further provide mechanisms for performing datapath driven detailed placement and legalization on the placement solution obtained from either, or both of, the directional weighting and insertion operation or the averaging technique. This datapath driven detailed placement and legalization can be implemented in a number of different ways using different types of detailed placement and legalization mechanisms, e.g., using cell swapping techniques, white space insertion techniques, cell shifting techniques, or the like. Regardless of which type of detailed placement and legalization mechanism, or mechanisms, used, the detailed placement and legalization is performed with regard to the preferred direction or orientation thereby making the detailed placement and legalization datapath driven.

FIG. 3 is an example block diagram of the components of a physical synthesis tool in which the improved placement mechanisms of the illustrative embodiments may be implemented. The elements shown in FIG. 3 may be implemented in software, hardware, or any combination of software and hardware without departing from the spirit and scope of the illustrative embodiments. For example, in one illustrative embodiment, the elements of FIG. 3 may be implemented as software instructions, stored in one or more data storage devices, and subsequently executed by one or more processors of one or more data processing systems.

Physical synthesis tool 300 may be any commercial physical synthesis tool (such as Synopsys IC Compiler within the Synopsys Galaxy™ Design Platform, Cadence Encounter Digital Implementation System, Magma Talus Platform, and the like), which is augmented to implement the preferred direction/orientation based placement mechanisms of the illustrative embodiments. Physical synthesis tool 300 comprises at least the components depicted in FIG. 3 but may comprise other components as well, as will be readily apparent to those of ordinary skill in the art in view of the present detailed description, without departing from the spirit and scope of the illustrative embodiments.

With regard to FIG. 3, design data 302 is the data set of design rules and specifications that are adhered to within the current device data set. Netlist 304 is the netlist for the current semiconductor device, e.g., an integrated circuit, which is being designed. As mentioned above, the netlist 304 is the list of the electrical components and the interconnections for those components. Global placement tool 306 places the geometries associated with the components indicated in netlist 304 into a global device geometry. The term "places" or "placement" as it is used herein means to put a simulated geometry of a device component within a simulated device. Global placement tool 306 places each of the components of the device into the confines of a region of the device having defined borders, and interconnects the components together in accordance with the netlist. Global placement tool 306 also checks for placement legality. An illegal placement has cells, i.e. groups of components with related interconnections, whose areas overlap.

In accordance with the illustrative embodiments, global placement tool 306 performs global placement operations based on a preferred direction or orientation of the cells of the semiconductor device design, integrated circuit design, or portion of the semiconductor device/integrated circuit design that is the subject of the placement processes. That is, the global placement tool 306 performs directional weighting and insertion operations with regard to cell placement.

The global placement tool 306 uses what is referred to as a "force-directed placement" (FDP) paradigm. The force-directed placement tool essentially consists of two main operations: (a) a linear system solver operation that obtains a globally optimum solution for a given set of constraints and design objectives (this solution typically generates a result that has significant overlap among the cells), and (b) a spreading operation is performed to reduce the overlap among the cells by spreading their relative placement and thereby add additional "spreading" constraints to the result generated by the linear system solver operation. These two operations are carried out in an iterative manner to reduce overlap among the cells until a stopping criterion is met. For example, the stopping criteria may be any of a number of different types of stopping criteria, such as when there is no appreciable reduction in the HPWL spread solution, when the average movements of modules due to spreading constraints converges, when the average density of the cells with respect to a certain regular grid structure is smaller than a predefined threshold (which can be set differently depending upon the placement algorithm implementation, e.g., run until the maximum density of cells is over 5.0), or the like. It should be noted that the spreading operation does not actually move the cells, but only determines expected locations of the cells that provide a reasonable reduction in overlap.

Once the spreading operation is performed to obtain expected locations, spreading forces are added to the design to reduce overlap among the cells. This is done by inserting a pseudo-net between each cell in the linear system solver result and its corresponding expected location obtained using the spreading operation. The weights on the pseudo-nets are increased for each subsequent application of the force-directed-placement (FDP) paradigm, in an iterative fashion, to progressively spread the cells and reduce overlap. By solving this modified linear system, placement converges to a solution with a smaller amount of overlap among the cells.

There are two types of forces or net-weights that interact with each other during force-directed placement: (a) the netlist forces as determined by the weights on the actual or "true" nets in the design, and (b) the spreading forces as determined by the weights on the pseudo-nets. The netlist forces try to minimize the wire length, whereas the spreading forces attempt to reduce overlap. The goal of FDP is to modulate these forces so as to obtain a placement with reduced overlap while obtaining good wire length. In the illustrative embodiments, spreading forces are added to reduce the overlap among the cells but the netlist forces or net-weights on the special nets, i.e. the high fanout nets (HFNs) or high fanout paths, dominate the spreading forces in an ideal direction or subset of ideal directions less than a total number of possible directions for spreading out. This could be horizontal/vertical/diagonal, or any combination of these directions in one, two, or three dimensions depending on the ideal direction for the cell(s). Hence, the illustrative embodiments spread in the ideal, or preferred, direction(s) while trying to achieve a compact placement of the cells/modules in the non-ideal, or non-preferred, direction(s).

With the illustrative embodiments, the global placement tool 306 utilizes a directional weighting and insertion engine 320 that performs pseudonet weighting and insertion but with modified weightings based on prior knowledge of the preferred direction or orientation of cells of a portion of the semiconductor device/integrated circuit device design. The preferred direction or orientation of the cells may be specified, for example, in design data 302, or may be determined based on a knowledge base of types of standardized cells 316 stored in association with physical synthesis tool 300, for example. Alternatively, the physical synthesis tool 300 may perform analysis of cells of the semiconductor/integrated circuit device design and determine a preferred direction or orientation of the particular cells based on a physical layout of the electrical components of the cells, the pins, or the like.

Depending upon how designers want to align a certain set of cells in horizontal and/or vertical directions/orientations, the pseudo-net weightings may be adjusted by the directional weighting and insertion engine 320 such that the global placement tool 306 finds locations for the set of cells with a radically high/low aspect ratio, i.e. high aspect ratio along the preferred direction(s)/orientation(s) and low aspect ratio along the non-preferred directions/orientations. For example, if a designer wants to align cells vertically, by increasing x-directional weighting by a factor of 100, for example, the linear system solver of the directional weighting and insertion engine 320 extremely optimizes the wirelength only in the x-dimension and generates a very compact placement in the x-dimension, resulting in tall and narrow placement for the set of cells. That is, the directional weighing increases the weights on "true" nets in the design and thus extremely optimize the wirelength in only one direction. With x-dimensional weighting, for example, stronger netlist forces are applied than spreading forces in the x-dimensional, resulting in compact solution in the x-dimensional, and the solution is permitted to spread in the y-dimension as normal. The resulting placement is thus, compact in the x-dimension and spread in the y-dimension.

This dramatic adjustment of weights based on preferred (or ideal) directions/orientations of cells may be performed with regard to any direction/orientation in two or three dimensions and is not limited to Cartesian axises. Moreover, the dramatic adjustment of weights is not limited to increasing weightings by a factor of 100 but may involve increases in weightings where the increases may be any desirable amount that achieves a desired directional or orientation based adjustment of the placement. Furthermore, while illustrative embodiments will be described in terms of the preferred direction/orientation being a single direction/orientation, the illustrative embodiments are not limited to such and the preferred direction/orientation may comprise a plurality of preferred directions/orientations. Moreover, each of the preferred directions/orientations may have relatively different levels of preference, i.e. there may be different increases in weighting based on a relative difference in levels of preference, but with the preferred directions/orientations being significantly more preferred over at least one other direction/orientation by having a significantly increased weighting over non-preferred directions/orientations.

In some illustrative embodiments, although not required in all illustrative embodiments, the global placement tool 306 may further comprise an averaging technique engine 330. That is, even though directional pseudo-net weighting is effective when spreading and aligning cells along a preferred direction or orientation, directional weighting may not always generate a perfectly aligned (i.e. straight line) placement of the cells. Based on the post-spreading locations of the cells, the averaging technique engine 330 operates to calculate the average (or center of gravity) location for a given set of cells that need to be aligned in a straight line, i.e. an average of the locations of the cells with regard to the preferred directions/orientations is generated and the cells are moved to align them with the average of the locations of the cells. That is, for example, the averaging technique engine 330 assigns the average location of one or more of the x, y or z-location of the given set of cells as the axis along which to align the cells in a straight line. For example, x-averaging takes an average of the x-locations of a set of cells to be aligned in a vertical direction, i.e. an average x location is determined and the cells are aligned along a vertical axis passing through the x location.

Global placement tool 306 stores the information for all of the placements in the physical placement database 308. Based on the global placement obtained using the directional/orientation based pseudonet weighing and insertion mechanisms and/or the averaging technique mechanisms, detailed placement operations may further be performed by detailed placement engine 312. That is, even after performing improved global placement using the mechanisms of the illustrative embodiment described above, some amount of overlap may still be present and/or improvement to wirelength may be obtainable. The elimination of the remaining overlap and wirelength improvement may be achieved through use of the directional/orientation based detailed placement and legalization of the illustrative embodiments.

Datapath driven detailed placement engine 312 performs moves on cells, referred to herein as cell transformations, along the preferred direction(s)/orientation(s) of the cells. Datapath driven detailed placement engine 312 ensures that these transformations are legal, e.g., overlaps of cells are avoided and other specified constraints on placement of the cells are satisfied. Datapath driven detailed placement engine 312 may comprise one or more cell transformation engines 314 for performing one or more types of cell transformations on the placement solution obtained from the global placement tool 306.

These one or more cell transformation engines 314 may perform various types of cell transformations depending upon the particular desired implementation. Such cell transformations are generally known in the art but are not constrained to preferred direction(s)/orientation(s) of cells. That is, cell swapping, cell shifting, and white space insertion cell transformations are generally known in the art but are not performed with regard to one or more designated preferred direction(s)/orientation(s) of cells of a portion of a semiconductor/integrated circuit design. However, in accordance with the illustrative embodiments, regardless of which particular types of cell transformations used in the particular implementation, the cell transformations are performed with regard to the preferred direction(s)/orientation(s) of the cells.

For example, one cell transformation engine 314 may perform a cell swapping transformation in which cells are swapped by swapping locations of the cells, e.g., cell A is placed at a location of cell B and cell B is placed at a location of cell A. In accordance with the illustrative embodiments, the search for cells that can be swapped in this manner is constrained to the preferred direction(s)/orientation(s). Thus, for example, if the preferred direction/orientation is a y-direction (vertical), then cells having a center point or portion of their area that is within a given tolerance of a y-axis passing through a selected cell are the only ones considered as candidates for swapping. For example, if cell A is a selected cell, then only cells that are within a given tolerance of a y-axis passing through a center of cell A are considered as candidates for swapping. Other criteria generally known in the art for performing swapping of cells may then be used with these candidates to determine an optimum configuration of the cells.

Similarly, as another example, a cell shifting transformation engine may be provided which performs an incremental shifting of cells. The incremental shifting, in accordance with the illustrative embodiments is performed along one or more of the preferred direction(s)/orientation(s). Thus, for example, if the preferred direction is a y-direction, the shifting of cells is only performed with regard to a y-axis running through a selected cell. Only other cells having a center point or a portion of their area whose position is within a given tolerance of this y-axis are considered as candidates for cell shifting.

As a further example, a white space insertion transformation engine may be provided which searches along a preferred direction/orientation of a selected cell, or set of cells, to find an amount of unoccupied area, i.e. white space, into which a cell may be moved in order to achieve a better wire length or achieve an improved configuration with regard to one or more design goals. Thus, a primary distinction between the cell transformations of the illustrative embodiments and known mechanisms is that the cell transformations are constrained to the defined or determined preferred direction(s)/orientation(s) of the cells that are the subject of the placement operations.

Physical synthesis tool 300 may have a static timing analysis engine 310 incorporated into the tool for performing static timing analysis on the resulting design to ensure that timing constraints for the semiconductor device/integrated circuit are satisfied by the resulting design and if not, identifying violations so that the design may be modified to achieve a desired timing. Although not shown in FIG. 3, other verification mechanisms may also be included in the physical synthesis tool 300, such as a dynamic timing analysis engine, or the like, without departing from the spirit and scope of the illustrative embodiments. The result is a verified design of a semiconductor/integrated circuit device that has an optimized placement of cells based on a preferred direction(s)/orientation(s) of the cells. Thus, an optimized design that is optimized for both low and high fanout nets is achieved.

Figure 4:
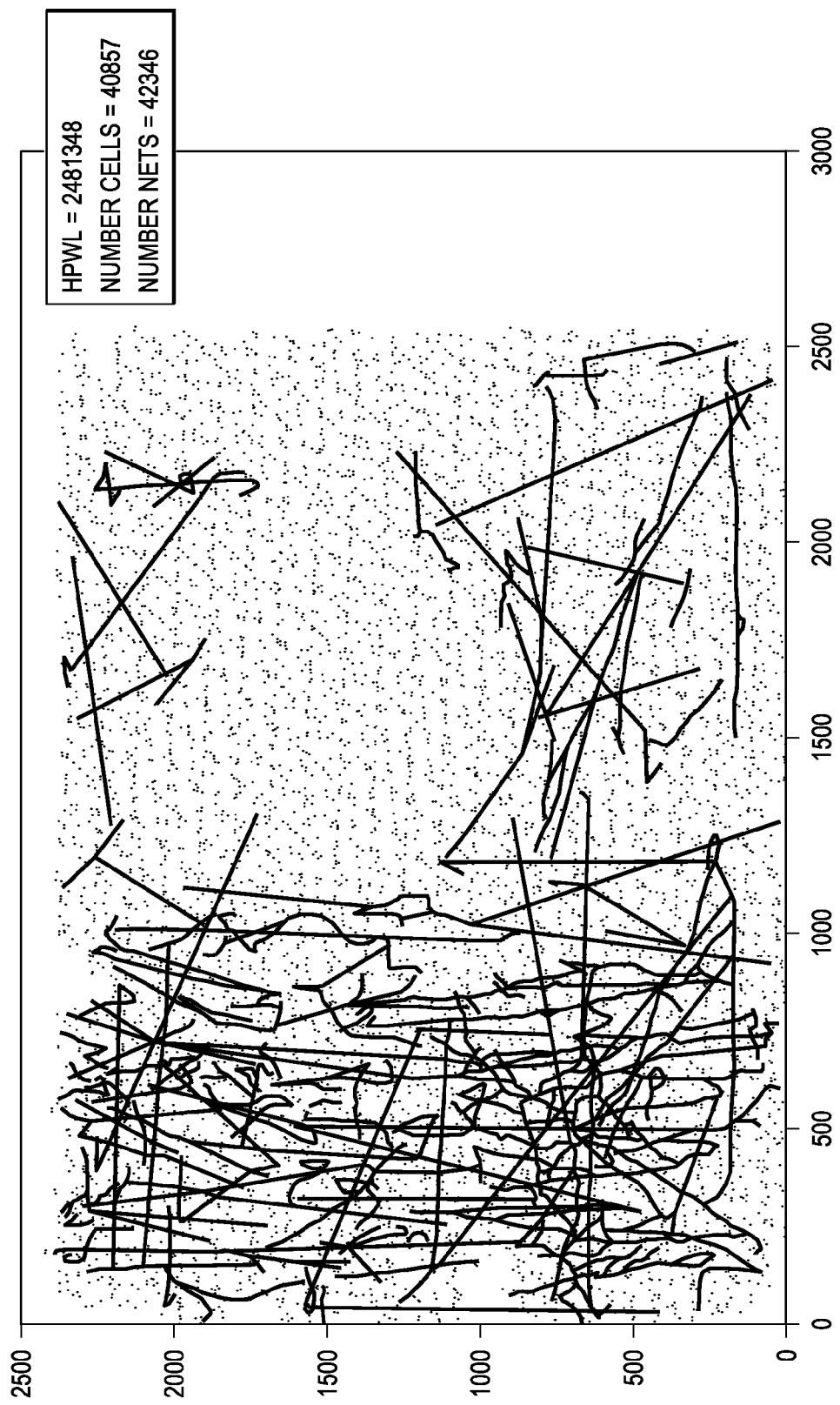
FIG. 4 is an example semiconductor device cell placement in accordance with a known mechanism that does not take into account preferred direction(s)/placement(s) as in the illustrative embodiments.
Figure 5:
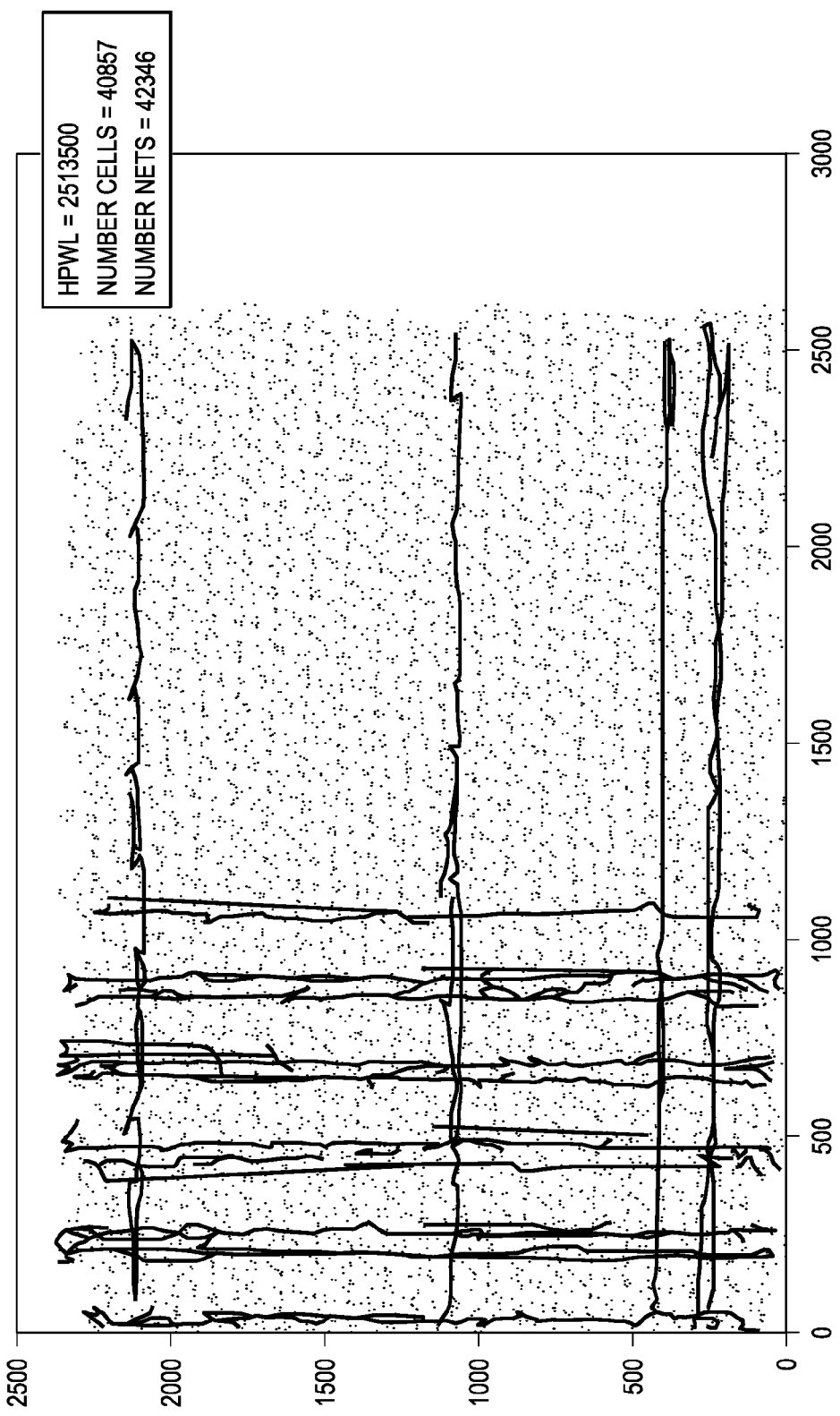
FIG. 5 is an example semiconductor device cell placement achieved through use of the mechanisms of the illustrative embodiments which take into account the preferred direction (s)/placement(s) of the cells.

To illustrate the improvement with regard to cell placement achieved through the mechanism of the illustrative embodiments, reference is now made to FIGS. 4 and 5 which illustrate example semiconductor device cell placements and wirings. FIG. 4 is an example semiconductor device cell placement in accordance with a know mechanism that does not take into account preferred direction(s)/placement(s) as in the illustrative embodiments. FIG. 5 is an example semiconductor device cell placement achieved through use of the mechanisms of the illustrative embodiments which take into account the preferred direction(s)/placement(s) of the cells. The small rectangular elements shown in FIGS. 4 and 5 represent cells of a semiconductor/integrated circuit design. Lines between these cells represent wirings or nets. Various wirings or nets are represented with the lines of shown in FIGS. 4 and 5 but due to the small scale of semiconductor/integrated circuits, it is difficult to depict the different nets such that they may be separately distinguishable. The important aspect of FIGS. 4 and 5, however, is the orientation or direction of these nets as can be clearly distinguished from a comparison of FIGS. 4 and 5.

With regard to FIGS. 4 and 5, the "legal HPWL" referred to in these figures essentially means that the placement does not have any overlap among the cells/modules. Ultimately the placement has to be legal for it to progress through the subsequent steps of physical synthesis. Hence, to make a valid comparison between placement solutions one should always look at the HPWL when all the legality constraints are met. Also, in terms of the difference in the numbers for legal HPWL between FIGS. 4 and 5, one important aspect is that the illustrative embodiments do not significantly degrade the total HPWL of the design by doing special processing (net-weighting) for the high fanout nets (HFNs) or high fanout paths. In other words, the illustrative embodiments are able to obtain much better placement of the HFNs and high fanout paths in terms of alignment without sacrificing overall design quality (as determined by the legal HPWL).

As shown in FIG. 4, the nets comprise wirings that run in various directions. That is, with the analytical placement of known mechanisms, no prior knowledge of preferred directions/orientations is used to constrain the aspect ratio of the placement and transformation of the placement of cells. As a result, the cells of high fanout nets may be located in various unaligned locations across the semiconductor/integrated circuit device. While this may achieve a good half-perimeter wire length with regard to low fanout nets, this cannot provide an optimized Steiner tree based wire length for high fanout nets in datapath circuits.

As shown in FIG. 5, the nets comprise wirings that are oriented along preferred direction(s)/orientation(s). Thus, it can be seen in FIG. 5 that the nets of high fanout nets run along aligned axises in the x and y directions. The configuration shown in FIG. 5 is obtained using the mechanisms of the illustrative embodiments by applying directional weighting and insertion, averaging techniques, and/or datapath driven detailed placement and legalization, as described above. From FIG. 5 it can be seen that by applying higher net weights only on perpendicular directions/orientations to preferred direction(s)/orientation(s) of each net, the placement mechanisms can reduce the span of each net in the undesired directions and keep the nets aligned along the preferred direction(s)/orientations. This gives an improved Steiner tree based wire length for high fanout nets.

Thus, with the mechanisms of the illustrative embodiments, the placement mechanisms may operate to provide an improved placement of cells for high fanout nets that takes into consideration preferred direction(s)/orientation(s) of the cells and thereby achieves an improved wire length approximation for these high fanout nets. With the mechanisms of the illustrative embodiments, when a Steiner wire length is determined after applying the mechanisms of the illustrative embodiments, an improved Steiner wire length is achieved, i.e. a reduced Steiner wire length value is obtained. The illustrative embodiments thus provide an improved reflection of the designer's intent with regard to cell placement for high fanout nets.

Figure 6:
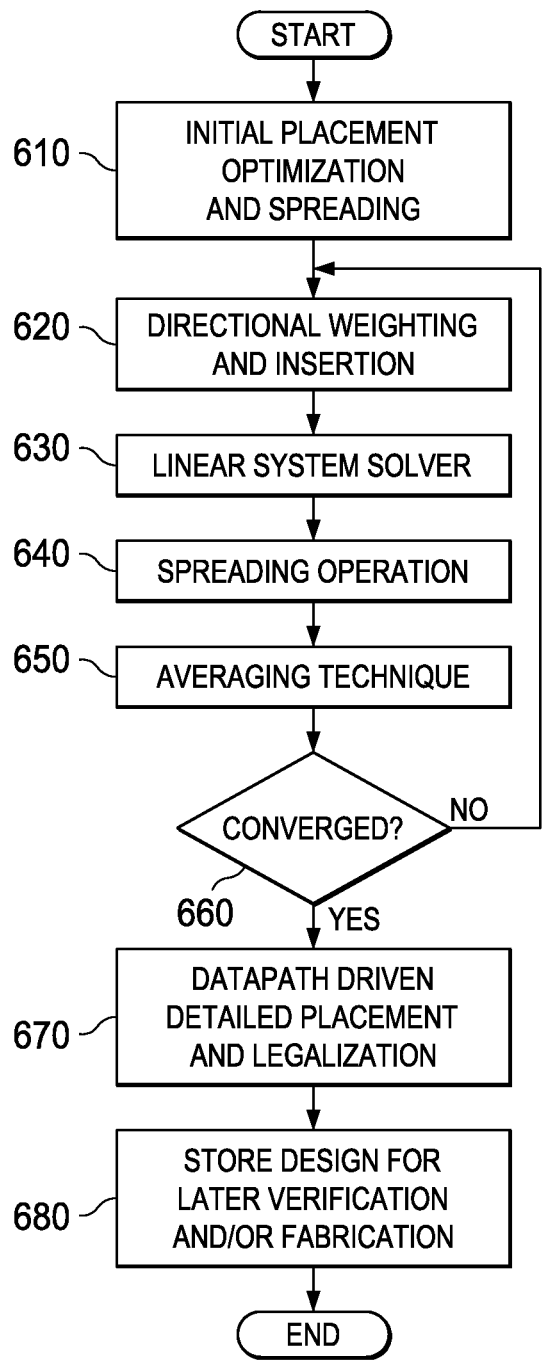
FIG. 6 is a flowchart outlining an example operation for performing cell placement in accordance with one illustrative embodiment.

FIG. 6 is a flowchart an example operation for the preferred direction/orientation constrained placement process in accordance with the illustrative embodiments. The process may be implemented within a physical synthesis tool, such as physical synthesis tool 300 in FIG. 3, for example.

As shown in FIG. 6, the operation starts by generating an initial placement design using spreading to reduce overlap (step 610). For example, this initial placement design may be generated using a linear system solution to obtain a globally optimal solution in terms of a specified design objective, e.g., a half-perimeter wire length (HPWL) minimization objective, with no spreading constraints. Thereafter, a spreading operation may be applied to the HPWL optimized global placement solution to reduce the overlap. As discussed above, this spreading operation gives "expected" locations for the cells but does not actually move the cells to the new locations.

A directional weighting and insertion operation is then performed on the cells/modules belonging to the high fanout nets (HFNs) or high fanout paths in the global optimal solution so as to force them to move in one or more specific directions, in accordance with an ideal or preferred orientation of the cells/modules, during a subsequent linear system solve operation (step 620). As discussed above, this operation may be achieved by adding spreading forces to reduce overlap among the cells. The addition of spreading forces may be achieved, for example, by inserting a pseudonet between each cell in the linear system solution and its corresponding "expected" location obtained after spreading. The weight on the pseudo-nets are increased during each iteration to progressively spread the cells and reduce overlap. Depending upon how designers want to align a certain set of cells, the pseudonet weightings are set such that directions/orientations that spreading of the nets into non-preferred directions/orientations is constrained.

The linear system solver is invoked with regard to the directional weightings and inserted pseudonets (step 630) and spreading is performed using fixed point generation (step 640). Essentially, the linear system solver solves a linear system, e.g., $Ax=b$ where A is a matrix and b is a vector. Given the position vector x, minimizing the HPWL can be modeled into a quadratic cost function, e.g., $cost = \frac{1}{2} * x^t * A * x - b^t x + constant$, and the optimum solution of the quadratic cost function can be found by solving the linear system $Ax=b$. Solving this linear system can be interpreted as finding the global optimum position vector x that minimizes total HPWL.

However, minimizing only wirelength can lead to excessive amount of cell overlaps. Therefore, the FDP operation of the illustrative embodiments, using directional pseudonet weightings, progressively updates the wirelength-driven cost function and solves the updated linear system to generate an overlap-free solution with good wirelength.

In order to direct the linear system into less-overlap configuration, FDP updates the linear system by increasing non-overlapping constraints as follows. The spreading is performed to get possible target positions where the cell should move to for less-overlap configuration. These target positions (or additional steps may be involved to find better target positions) are added to the netlist as pseudo fixed cells, referred to in step 640 as fixed point generation. Then these fixed points are connected to their corresponding cells in the linear system via pseudo-nets. This step can be done by adding pseudo-net weights to diagonal elements in matrix A and (pseudo-net weight*fixed-point position) to vector b, for example. Solving the updated linear system $A'x=b'$ will generate solution with less-overlaps while sacrificing the WL.

The averaging technique described above for modifying the placement of cells with regard to an average placement of the cells relative to the preferred direction(s)/orientation(s) is performed (step 650). A determination is made as to whether the placement has converged (step 660). The determination of convergence can be made based on any of a number of different criteria as previously discussed above. If the placement has not yet converged, then the operation returns to step 620 and the process of steps 620-660 is repeated to achieve greater optimization of the placement.

If the placement has converged, then datapath driven detailed placement and legalization is performed (step 670). As discussed above, this datapath driven detailed placement and legalization may employ one or more detailed placement techniques including, for example, one or more of cell swapping, cell shifting, white space insertion, or the like. The detailed placement technique(s) utilized for performing datapath driven detailed placement and legalization is/are constrained to the preferred direction(s)/orientation(s) of the cells that are the subject of the placement operation. Once the datapath driven detailed placement and legalization is completed, the resulting semiconductor/integrated circuit device design is stored for later verification and use in fabricating the device (step 680) and the operation terminates.

The mechanisms described above may be used in design and the fabrication of semiconductor/integrated circuit devices or chips. For example, the resulting semiconductor/ integrated circuit devices or chips can be distributed by a fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor. Moreover, the end products in which the integrated circuit chips may be provided may include game machines, game consoles, hand-held computing devices, personal digital assistants, communication devices, such as wireless telephones and the like, laptop computing devices, desktop computing devices, server computing devices, or any other computing device.

Figure 7:
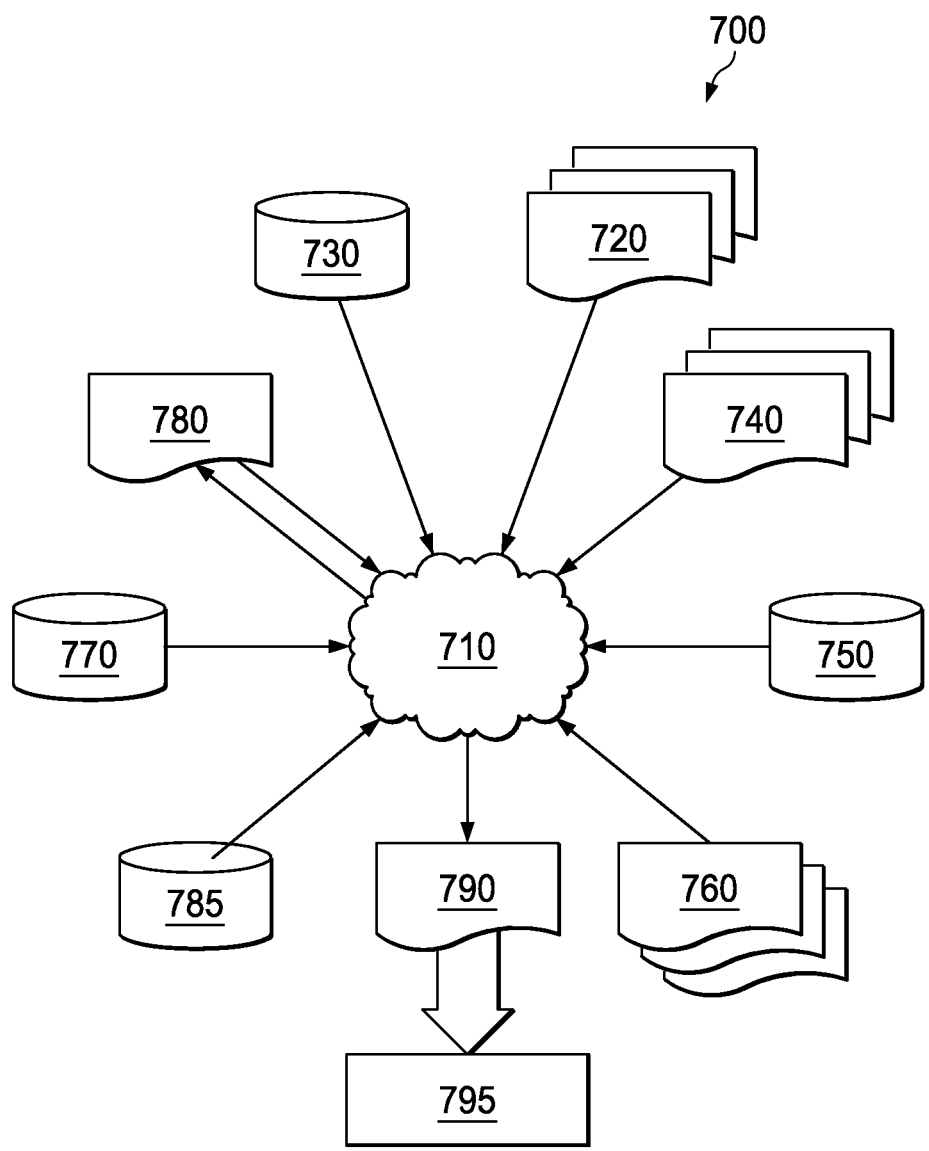
FIG. 7 is a flow diagram of a design process used in semiconductor design, manufacture, and/or test.

FIG. 7 shows a block diagram of an exemplary design flow 700 used for example, in semiconductor design, manufacturing, and/or test. Design flow 700 may vary depending on the type of IC being designed. For example, a design flow 700 for building an application specific IC (ASIC) may differ from a design flow 700 for designing a standard component. Design structure 720 is preferably an input to a design process 710 and may come from an IP provider, a core developer, or other design company or may be generated by the operator of the design flow, or from other sources. Design structure 720 comprises an a semiconductor/integrated circuit design generated using the mechanisms in accordance with one or more of the illustrative embodiments described above in the form of schematics or HDL, i.e. a hard ware-description language (e.g., Verilog, VHDL, C, etc.).

Design structure 720 may be contained on one or more machine readable medium. For example, design structure 720 may be a text file or a graphical representation of an embodiment of a semiconductor/integrated circuit device designed using the mechanisms of one or more illustrative embodiments as described above. Design process 710 preferably synthesizes (or translates) a design of an semiconductor/integrated circuit device into an optimized netlist 780 by implementing mechanisms in accordance with one or more illustrative embodiments as described above, where netlist 780 is, for example, a list of wires, transistors, logic gates, control circuits, I/O, models, etc. that describes the connections to other elements and circuits in an integrated circuit design and recorded on at least one of machine readable medium. This may be an iterative process in which netlist 780 is resynthesized one or more times depending on design specifications and parameters for the circuit.

Design process 710 may include using a variety of inputs; for example, inputs from library elements 730 which may house a set of commonly used elements, circuits, and devices, including models, layouts, and symbolic representations, for a given manufacturing technology (e.g., different technology nodes, 32 nm, 45 nm, 90 nm, etc.), design specifications 740, characterization data 750, verification data 760, design rules 770, and test data files 785 (which may include test patterns and other testing information). For example, the library elements 730, design specifications 740, and/or characterization data 750 may specify preferred direction(s)/orientation(s) of cells for use in performing placement in accordance with the illustrative embodiments. Moreover, the design rules 770, for example, may specify placement constraints, thresholds, and the like for implementing placement operations, performing legalization, and the like, in accordance with the illustrative embodiments.

Design process 710 may further include, for example, standard circuit design processes such as timing analysis, verification, design rule checking, place and route operations, etc. One of ordinary skill in the art of integrated circuit design can appreciate the extent of possible electronic design automation tools and applications used in design process 710 without deviating from the scope and spirit of the invention. The design structure generated by way of the mechanisms of the illustrative embodiments is not limited to any specific design flow.

Design process 710 preferably translates an embodiment of a semiconductor/integrated circuit device design into a second design structure 790. Design structure 790 resides on a storage medium in a data format used for the exchange of layout data of integrated circuits (e.g., information stored in a GDSl1 (GDS2), GL1, OASIS, or any other suitable format for storing such design structures). Design structure 790 may comprise information such as, for example, test data files, design content files, manufacturing data, layout parameters, wires, levels of metal, vias, shapes, data for routing through the manufacturing line, and any other data required by a semiconductor manufacturer to produce a semiconductor/integrated circuit device designed in accordance with the illustrative embodiments. Design structure 790 may then proceed to a stage 795 where, for example, design structure 790 proceeds to tape-out, is released to manufacturing, is released to a mask house, is sent to another design house, is sent back to the customer, etc.

As noted above, it should be appreciated that the illustrative embodiments may take the form of an entirely hardware embodiment, an entirely software embodiment or an embodiment containing both hardware and software elements. In one example embodiment, the mechanisms of the illustrative embodiments are implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing system comprising a processor and a memory, for performing placement of cells in a design of a semiconductor device, comprising:
generating, by the data processing system, an initial design of the semiconductor device, the initial design comprising a first placement of cells;
determining, by the data processing system, a preferred direction of placement associated with the cells, wherein the preferred direction is a direction along which spreading of the cells is preferred; and
generating, by the data processing system, a second design of the semiconductor device by modifying the first placement of the cells to generate a second placement of cells, different from the first placement cells, based on the preferred direction of placement associated with the cells, wherein modifying the placement of cells comprises applying weights to nets of the initial design based on the preferred direction of placement, wherein generating the second design of the semiconductor device comprises performing directional weighting and insertion on the initial design to insert pseudonets into the initial design and assign weights to the pseudonets based on the preferred direction of placement associated with the cells, wherein the method is performed repeatedly in an iterative manner, and wherein, for each subsequent iteration of the method, the weights assigned to the inserted pseudonets are increased, and wherein the increasing of the weights assigned to the inserted pseudonets causes a spreading of the placement of the cells in the design of the semiconductor device, and wherein the pseudonets are representations of real nets between cells of the design of the semiconductor device but are not real nets of the semiconductor device and are used for placement purposes only.

2. The method of claim 1, wherein the weights are applied to the nets of the initial design to cause the second placement of cells to be generated by reducing a span of the nets in one or more non-preferred directions and increase a span of the nets in the preferred direction.

3. The method of claim 1, wherein pseudonets that are not substantially along the preferred direction of placement associated with the cells are associated with relatively larger weights than pseudonets that are substantially along the preferred direction of placement.

4. The method of claim 1, wherein generating a second design of the semiconductor device comprises:
performing an averaging operation on the first placement of cells with regard to the preferred direction to determine an average position of the cells relative to the preferred direction; and
modifying the first placement of cells to generate the second placement of cells based on the average position of the cells relative to the preferred direction.

5. The method of claim 1, further comprising:
performing datapath driven detailed placement and legalization operation on the second design of the semiconductor device, based on the preferred direction such that modifications to the second design of the semiconductor device, performed by the datapath driven detailed placement and legalization operation, are along the preferred direction.

6. The method of claim 5, wherein the datapath driven detailed placement and legalization operation comprises at least one of a cell swapping operation, a white space insertion operation, or a cell shifting operation, along the preferred direction, and wherein the datapath driven detailed placement and legalization operation is constrained to be performed only along the preferred direction.

7. The method of claim 1, wherein the second design of the semiconductor device has a relatively high aspect ratio along the preferred direction and relatively low aspect ratio along one or more non-preferred directions as a result of the modification of the first placement of cells to generate the second placement of cells.

8. The method of claim 1, wherein the preferred direction is one of a plurality of preferred directions of placement associated with the cells, and wherein the method is performed with regard to each of the plurality of preferred directions of placement associated with the cells.

9. The method of claim 1, further comprising:
generating a third design of the semiconductor device based on the second design of the semiconductor device; and
outputting the third design of the semiconductor device to facilitate fabrication of the semiconductor device.

10. The method of claim 1, further comprising:
fabricating the semiconductor device based on the second design of the semiconductor device.

11. The method of claim 1, wherein the preferred direction of placement is specified in design data input to the data processing system and is associated with data of the cells.

12. The method of claim 1, wherein the preferred direction of placement is specified in a knowledge base of standardized cells associated with a physical synthesis tool, and wherein each of the standardized cells in the knowledge base has a corresponding specified preferred direction of placement, and wherein at least two of the standardized cells have preferred directions of placement that are different from each other.

13. The method of claim 1, wherein the preferred direction of placement comprises a plurality of preferred directions of placement, and wherein each of the preferred directions of placement in the plurality of preferred directions of placement has an associated level of preference value, and wherein at least one preferred direction of placement in the plurality of preferred directions of placement has a different level preference value from another preferred direction of placement in the plurality of preferred directions of placement.

14. The method of claim 1, wherein inserting pseudonets comprises, for each cell of the design, inserting a pseudonet connecting the cell at a current placement of the cell in the first placement of cells, with an expected placement of the cell generated after performing a spreading operation on the first placement of cells.

15. The method of claim 1, wherein the weights applied to nets of the initial design generate netlist forces that are operated on by the method to minimize wire length in the second design, and wherein weights applied to the pseudonets generate spreading forces that are operated on by the method to minimize overlap of cells in the second design.

16. A computer program product for performing placement of cells zip a design of a semiconductor device, the computer program product comprising:
non-transitory computer readable storage medium;
first program instructions to generate an initial design of the semiconductor device, the initial design comprising a first placement of cells;
second program instructions to determine a preferred direction of placement associated with the cells, wherein the preferred direction is a direction along which spreading of the cells is preferred; and third program instructions to generate a second design of the semiconductor device by modifying the first placement of the cells to generate a second placement of cells, different from the first placement cells, based on the preferred direction of placement associated with the cells, wherein the first, second, and third program instructions are stored on the non-transitory computer readable storage medium, wherein modifying the placement of cells comprises applying weights to nets of the initial design based on the preferred direction of placement, wherein the third program instructions to generate the second design of the semiconductor device comprises program instructions to perform directional weighting and insertion on the initial design to insert pseudonets into the initial design and assign weights to the pseudonets based on the preferred direction of placement associated with the cells, wherein the first, second and third program instructions are executed repeatedly in an iterative manner, and wherein, for each subsequent iteration of the method, the weights assigned to the inserted pseudonets are increased, and wherein the increasing of the weights assigned to the inserted pseudonets causes a spreading of the placement of the cells in the design of the semiconductor device, and wherein the pseudonets are representations of real nets between cells of the design of the semiconductor device but are not real nets of the semiconductor device and are used for placement purposes only.

17. The computer program product of claim 16, wherein pseudonets that are not substantially along the preferred direction of placement associated with the cells are associated with relatively larger weights than pseudonets that are substantially along the preferred direction of placement.

18. The computer program product of claim 16, wherein the third program instructions to generate a second design of the semiconductor device comprise program instructions to:
perform an averaging operation on the first placement of cells with regard to the preferred direction to determine an average position of the cells relative to the preferred direction; and
modify the first placement of cells to generate the second placement of cells based on the average position of the cells relative to the preferred direction.

19. The computer program product of claim 16, further comprising:
fourth program instructions to perform datapath driven detailed placement and legalization operation on the second design of the semiconductor device, based on the preferred direction such that modifications to the second design of the semiconductor device, performed by the datapath driven detailed placement and legalization operation, are along the preferred direction.

20. The computer program product of claim 19, wherein the datapath driven detailed placement and legalization operation comprises at least one of a cell swapping operation, a white space insertion operation, or a cell shifting operation, along the preferred direction, and wherein the datapath driven detailed placement and legalization operation is constrained to be performed only along the preferred direction.

21. The computer program product of claim 16, wherein the preferred direction is one of a plurality of preferred directions of placement associated with the cells, and wherein the method is performed with regard to each of the plurality of preferred directions of placement associated with the cells.

22. The computer program product of claim 16, further comprising;
fourth program instructions to fabricate the semiconductor device based on the second design of the semiconductor device.

23. An apparatus, comprising:
a processor; and
a memory coupled to the processor, wherein the memory comprises instructions which, when executed by the processor, cause the processor to:
generate an initial design of a semiconductor device, the initial design comprising a first placement of cells;
determine a preferred direction of placement associated with the cells, wherein the preferred direction is a direction along which spreading of the cells is preferred; and
generate a second design of the semiconductor device by modifying the first placement of the cells to generate a second placement of cells, different from the first placement cells, based on the preferred direction of placement associated with the cells, wherein modifying the placement of cells comprises applying weights to nets of the initial design based on the preferred direction of placement, wherein generating the second design of the semiconductor device comprises performing directional weighting and insertion on the initial design to insert pseudonets into the initial design and assign weights to the pseudonets based on the preferred direction of placement associated with the cells, wherein the instructions are executed repeatedly in an iterative manner, and wherein, for each subsequent iteration of the method, the weights assigned to the inserted pseudonets are increased, and wherein the increasing of the weights assigned to the inserted pseudonets causes a spreading, of the placement of the cells in the design of the semiconductor device, and wherein the pseudonets are representations of real nets between cells of the design of the semiconductor device but are not real nets of the semiconductor device and are used for placement purposes only.

* * * * *